United States Patent [19]

Koenemann et al.

[11] Patent Number: 5,617,426

[45] Date of Patent: Apr. 1, 1997

[54] CLOCKING MECHANISM FOR DELAY, SHORT PATH AND STUCK-AT TESTING

[75] Inventors: Bernd K. F. Koenemann, Hopewell Junction; William H. McAnney, LaGrangeville; Mark L. Shulman, Staatsburg, all of N.Y.

[73] Assignee: International Business Machines Corporation, Armonk, N.Y.

[21] Appl. No.: 393,511

[22] Filed: Feb. 21, 1995

Related U.S. Application Data

[63] Continuation of Ser. No. 811,205, Dec. 20, 1991, abandoned.

[51] Int. Cl.[6] .................................................. H04B 17/00
[52] U.S. Cl. ............................................ 371/22.3; 371/62
[58] Field of Search .......................... 371/22.3, 62, 22.1, 371/22.5, 22.6; 395/183.06

[56] References Cited

U.S. PATENT DOCUMENTS

| | | | |
|---|---|---|---|
| 4,669,061 | 5/1987 | Bhavsar | 365/154 |
| 5,018,144 | 5/1991 | Corr et al. | 371/22.3 |
| 5,079,725 | 1/1992 | Geer et al. | 371/22.3 |
| 5,084,874 | 1/1992 | Whetsel, Jr. | 371/22.3 |
| 5,172,377 | 12/1992 | Robinson et al. | 371/22.3 |
| 5,173,864 | 12/1992 | Watanabe et al. | 371/22.3 |

FOREIGN PATENT DOCUMENTS 0130610  7/1984  European Pat. Off. .

OTHER PUBLICATIONS

Dervisoglu "Scan Pata Architecture For Pseudorandom Testing" IEEE Design & Test of Computers, Aug. 1989 pp. 32–48.

"Shift Register Latch for Delay Testing" IBM Tech. Disclosure Bulletin vol. 32 No. 4A Sep. 1989 pp. 231–232.

"Latch to Latch Delay Testing in LSSD Using a Three-Latch SRL" IBM Tech Disclosure Bulletin vol. 31 No. 5 Oct. 1988.

Bula, O. et al., "Gross delay defect evaluation for a CMOS logic design system product", IBM Journal of Research and Development, vol. 34, No. 2/3, Mar. 1990, pp. 325–337.

Motika, F. et al., "A logic chip delay-test method based on system timing", IBM Journal of Research and Development, vol. 34, No. 2/3, Mar. 1990, pp. 299–312.

*Primary Examiner*—Hoa T. Nguyen
*Assistant Examiner*—Joseph E. Palys
*Attorney, Agent, or Firm*—Lawrence D. Cutter

[57] ABSTRACT

In a level sensitive scan design (LSSD) circuit embodiment for testing the behavior of logic circuits, a mechanism is provided for generating a skewed load of data into a set of shift register scan string latches. The nature of the input scan string assures that a certain number of 0 to 1 or 1 to 0 transitions occurs as an input to the block of logic being tested. Furthermore, a mechanism for delaying by one system clock cycle time the capture of information from the logic block in a second shift register scan string provides a mechanism for testing for the occurrence of short paths and long paths while preserving testability for stuck-at faults. Furthermore, all of these advantages are achieved without impacting the traditional stuck-fault test capabilities of the level sensitive scan design methodology.

2 Claims, 7 Drawing Sheets

CLOCKING MECHANISM FOR DELAY, SHORT PATH AND STUCK-AT TESTING

This application is a continuation of application Ser. No. 07/811,205, filed Dec. 20, 1991, now abandoned.

BACKGROUND OF THE INVENTION

The present invention is generally directed toward the testing of digital logic computer circuits. More particularly, the present invention is directed towards a clock timing relationship during test that provides a means for testing such circuits for circuit delay faults and short path faults, as well as the more traditional stuck-at faults. Even more particularly, the present invention is directed to clocking means and a method for operating test circuits constructed in accordance with level sensitive scan design (LSSD) circuit construction methodology.

The increasing ability, from a technology point of view, of being able to position semiconductor logic devices in ever increasing densities on electronic chip substrates has lead to a great increase in circuit complexity. Because of this increase in complexity, it has become more difficult to test semiconductor chip devices, particularly such devices which are meant to implement digital computer logic circuits.

Accordingly, it has been found desirable to add to the circuits themselves mechanisms which provide on-chip test capabilities. These capabilities often find representation in the LSSD design rules wherein a block of logic is surrounded (logically if not physically) on two sides by shift register latch scan strings. These scan strings typically comprise a plurality of shift register latches (SRLs) each of which must have two latches, L1 and L2, which are connected in master-slave fashion. During normal functioning of the circuits, information signals are stored in the SRLs by one or more system clocks. During test operations, test patterns or bit sequences are shifted into these SRLs using their shift register mode of operation with separate shifting clocks. These test patterns are used as stimuli to the logic block. These signals are subsequently propagated through the logic block and are captured in a second set of master-slave latch pairs at a predetermined point in time. This point in time can be determined for the logic circuit block in a known technology since it takes a certain known amount of time for signals to propagate through the individual logic gates in the block.

Various clocking sequences are used during test operations. Sequences are used to scan input test data into the shift register latch scan string to provide input test signals to the circuit block being tested. Clock sequences may also be provided to launch signals from the input shift register latches into the inputs of the circuit block and also to capture responses from the outputs of the circuit block into a second set of latches. For purposes of understanding the present invention, however, it is not absolutely necessary that the second set of latches be configured in a scan string, although this is certainly desirable for scanning out the resulting test data in a serial fashion.

In the typical test operation of circuits built in accordance with LSSD design methodologies, a test pattern is scanned in to the slave latches in the shift register scan string. This is accomplished by shifting data along the latch pairs in the string so as to load data information in the slave latches of each latch pair. This data is used as excitation for the logic circuit whose output response is captured in a second set of master-slave latches (also preferably disposed in a scan string) located at the output of the logic circuit block being tested. One of the aspects of this form of testing is that at the end of the process of scanning in excitation data, each master-slave latch pair in the shift register scan string possesses the same data bit, that is, either a 0 or a 1. This mechanism provides tests for so-called stuck-at faults in which a signal on a net appears to be fixed and does not vary with changes to the input of the net. Because of this characteristic, these faults can be observed during low-speed testing.

While the above mentioned test procedures and methodology may be employed to perform tests for stuck-at faults in the circuit logic, they are inadequate for other kinds of tests which are very desirable.

In normal usage, it is desired to operate these computer circuits at high speeds. It is, therefore, desirable to provide minimal delay between the time that the computer clocking mechanisms launch the input data from the first set of latches and that later time when the responses to this data are captured in the second set of latches. This time delay is typically determined during the design process of the computer circuit by computing the maximum signal propagation delay through the block. In fact, it is common (if somewhat risky) to slightly overlap the launch and the capture clock pulses to improve the clock cycle of the computer circuits. However, this clock overlap causes a so-called race condition. If the logic block being tested has a path between input and output signal lines with a very short delay, a changing signal can be launched along this path and the resulting incorrect data captured in an output latch pair, all during the clock overlap. Such a short path or "sneak path" may have been originally designed into the logic block or may occur during manufacture as the result of the accumulation of "fast" circuits along the path. For whatever reason, it is desirable to determine, during post-manufacturing tests, whether or not such a short path exists.

In a similar manner, it is possible that there may exist, in the logic block to be tested, a signal path which is longer than designed for or desired. It would therefore be useful to also be able to test for this condition during test operations that occur subsequent to manufacture but prior to shipment of the circuit chip or its installation in a machine. Short path faults, as described above, and these long path or delay faults generally manifest themselves only during at-speed operation of the circuits.

It is seen, therefore, that while LSSD test methodologies are important in detecting stuck-at fault conditions, they are generally not useful in detecting short path or delay fault conditions, even though all of these faults are permanent errors in the logic.

SUMMARY OF THE INVENTION

In accordance with a preferred embodiment of the present invention, a digital logic circuit for testing a block of logic circuits comprises a first shift register latch scan string with a plurality of master and slave latch pairs connected to operate as a shift register and also to act as an input signal means for the logic block being tested. A second set of latch pairs is connected to the output signal lines from the block under test and its latch pairs also comprise master and slave latches. A clocking mechanism is provided for shifting signal values along the scan string one latch at a time. Another clock mechanism is provided for controlling the capture of output signals from the logic block into the master latches in the second set of latch pairs. Another clock mechanism is provided for launching test signals into the input signal lines of the block under test. Lastly, a "clock pulse swallower circuit" is employed as a means for suppressing a single pulse from the second clock mechanism, that is the mechanism that controls the capturing of the block output signals.

More particularly, the clocking mechanism for shifting signal values along the scan string latches is employed to perform a "skewed load". In a skewed load, the shift register loading operation concludes with a shift clocking of the master latch (rather than that of the slave latch which is usual). Hence, after a skewed load, the desired test pattern is stored in the master latches, but has not yet been shifted into the slave latches. Quite commonly after a skewed load the master and the slave latches in a particular master-slave latch pair will contain different logical signals. In this situation, transferring the signal value from a master latch into its corresponding slave latch will launch a signal transition (either from 0 to 1 or from 1 to 0) into the logic block.

Now the typical sequence of clocks during system operation consists of an at-speed repetition of master-slave clock pairs (or a master-slave, master-slave, master-slave, . . . sequence). During a test using the present invention, the basic clock sequence will consist of what would normally be two at-speed clock pairs; (master-slave, master-slave); with however one distinct and unusual feature—the first master clock is suppressed, leaving the sequence as (slave, master-slave).

In particular, it is this controlled and at-speed clock sequence that is used to provide the excitation signals for short path tests and for delay tests. Even more particularly, the present invention describes a clock network and mechanism which readily permits these tests to be carried out with only relatively minor modifications to clock circuitry which usually appears on a chip.

Accordingly, it is an object of the present invention to provide a means for short path testing of digital logic circuits.

It is also an object of the present invention to provide a mechanism for testing digital logic circuits for long path delay fault conditions.

It is a still further object of the present invention to extend and enhance the capabilities associated with the level sensitive scan design methodology.

It is a still further object of the present invention to provide stuck-at fault testing.

It is a still further object of the present invention to provide an easily implemented mechanism for built-in testing of short path, long path, and stuck-at faults.

Lastly, but not limited hereto, it is an object of the present invention to improve the quality of integrated circuit chip devices which are incorporated in electrical systems employing logic circuits, and especially in digital data processing machinery.

DESCRIPTION OF THE DRAWING

The subject matter which is regarded as the invention is particularly pointed out and distinctly claimed in the concluding portion of the specification. The invention, however, both as to organization and method of practice, together with the further objects and advantages thereof, may best be understood by reference to the following description taken in connection with the accompanying drawings in which:

DETAILED DESCRIPTION OF THE INVENTION

Figure 1:
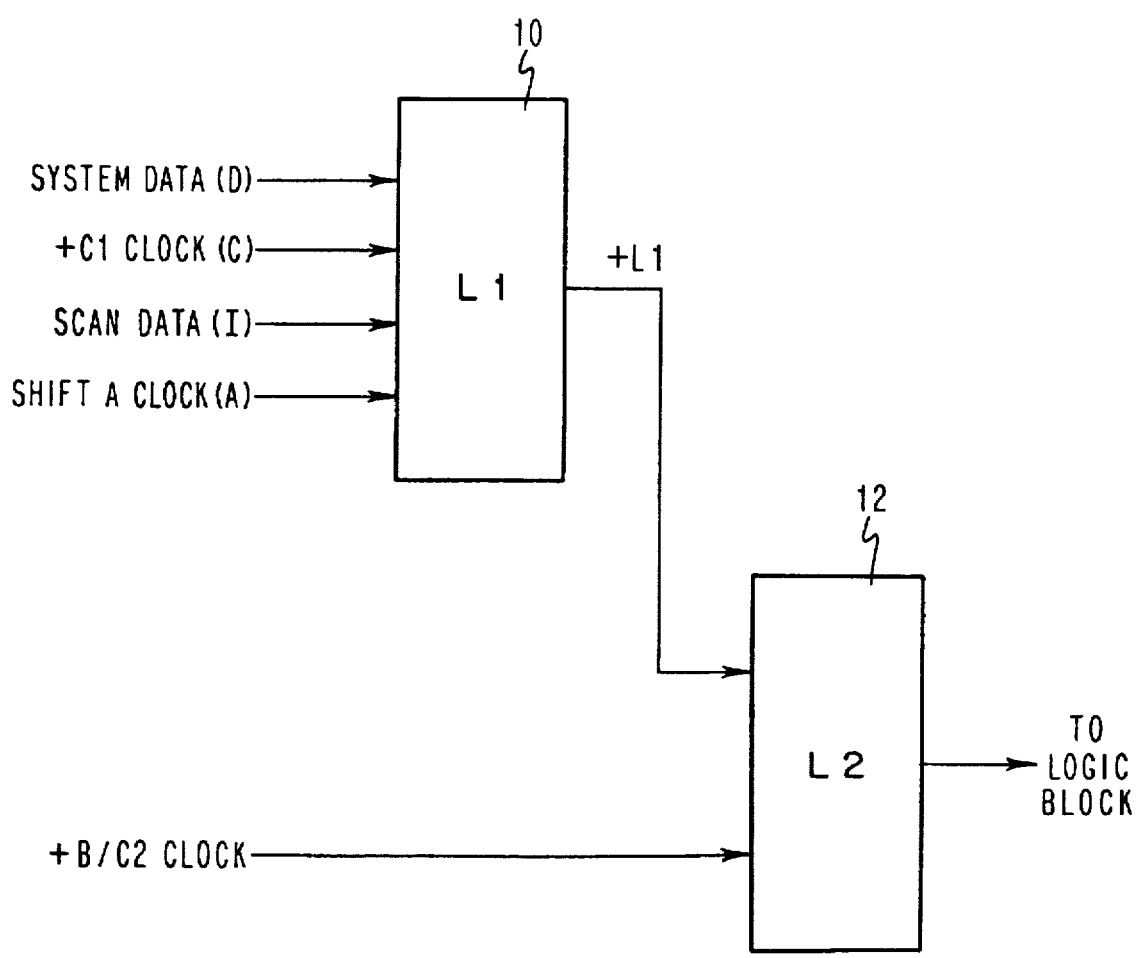
FIG. 1 is an electrical block diagram illustrating the signals applied to master-slave latch pairs present in shift register latch scan strings.
Figure 3A:
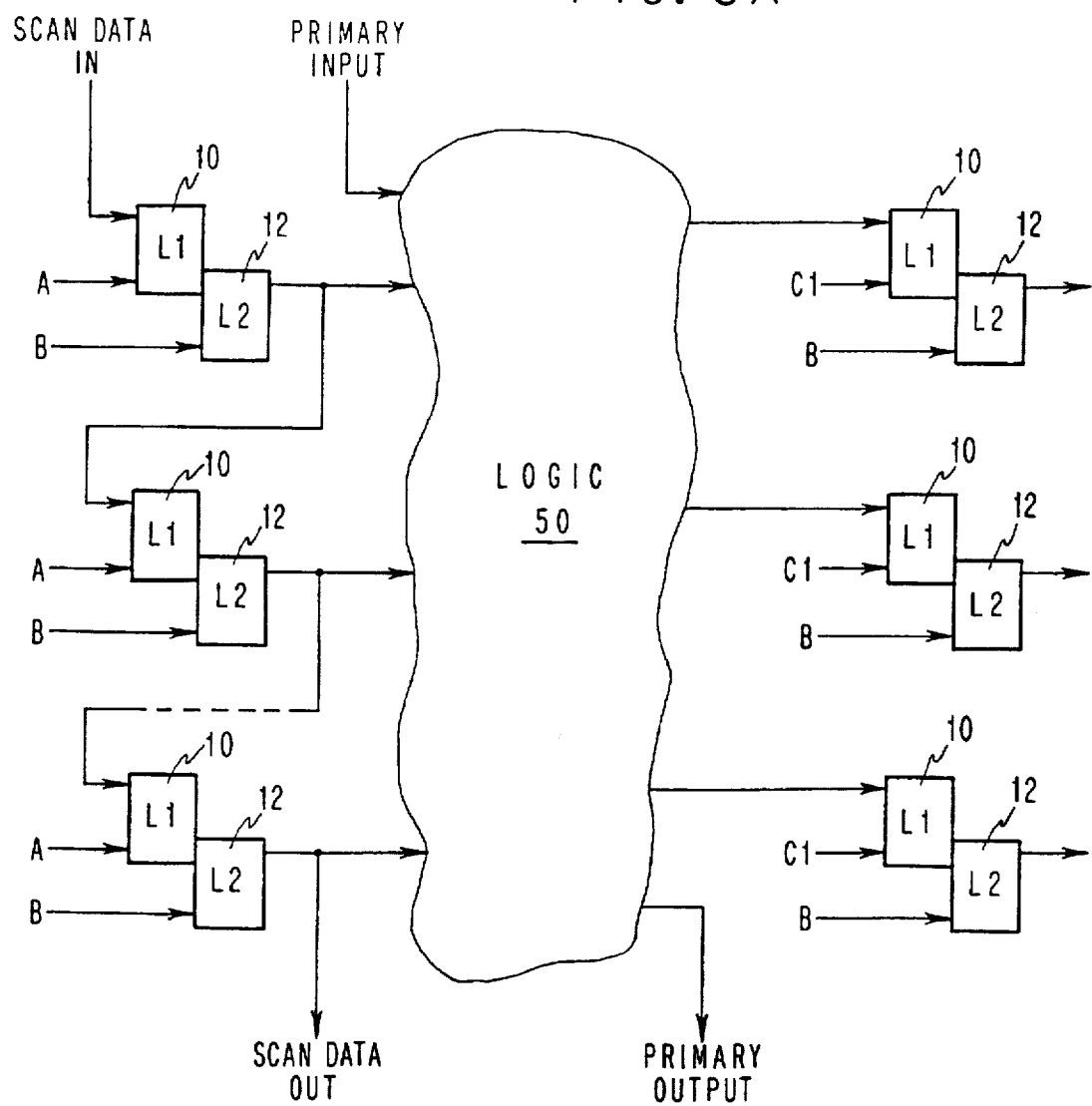
FIG. 3A is a schematic block diagram illustrating the relationship between a logic block being tested and shift register latch scan strings which are meant to supply input test data and to capture output signal information.

In the level sensitive scan design methodology, shift register latch scan strings are employed, as illustrated in FIG. 3A discussed below. In such scan strings, pairs of latches are employed. These latches are usually connected in a master-slave relationship such as that shown in FIG. 1. Each pair of latches L1 and L2 as shown in FIG. 3A (master latch L1 being designated by reference numeral 10 and slave latch L2 by reference numeral 12) comprises a single shift-register stage as illustrated by FIG. 1. An understanding of FIG. 1 is important for understanding the operation of the present invention, and may be obtained in the following U.S. Pat. Nos. 3,783,254, 3,761,695, 3,784,907 and in the publication "A Logic Design Structure for LSI Testability," by E. B. Eichelberger and T. W. Williams, 14th Design Automation Conference Proceedings, IEEE Computer Society, Jun. 20–22, 1977, pages 462–467, New Orleans, La. It is also important to understand that the shift register latch scan strings generally operate in two modes. In the normal mode of operation, the SRLs of the scan strings serve as a data source for logic inputs to logic circuit blocks which perform operations on the data supplied. In a second (test) mode of operation, test data is loaded into the shift register latch scan string which operates as a shift register to accept the test data which is then used to excite and exercise the logic functions defined within the logic circuit block being tested.

Accordingly, in the test mode of operation a series of bit values are loaded into the latches through Scan Data input line (labeled I in FIG. 1). This data is scanned into latch L1 by operation of Shift A Clock (labeled A in FIG. 1). A second clock used for scanning in data is the B Clock shown as controlling latch L2. The output of latch L2 is directed to the logic block being tested and also to a subsequent L1 latch in the shift register scan string chain. It is noted that FIG. 1 indicates that the clock signal being supplied to latch L2 is designated as the "+B/C2 Clock". The "+" sign indicates that it is the logical positive value of this clock which causes transfer of data from latch L1 to latch L2. The "/" indicates that this particular clock signal input to latch L2 is provided either from the clock mechanism for scanning in data (the B Clock) or from the system clock C2, more particularly described below. The two sources of the +B/C2 clock signal have different performance requirements (the B clock running at a relatively slow scan rate and the C2 clock running at the system speed rate) and the dual clocks make it possible to simplify the wiring of the clock distribution system.

Figure 2A:
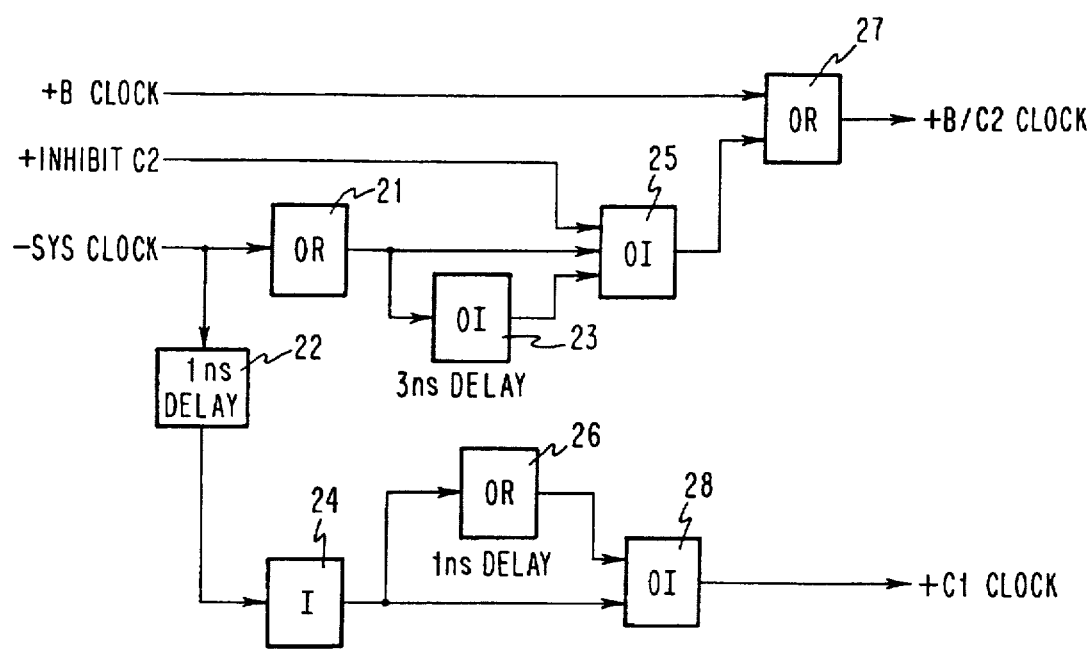
FIG. 2A is an electrical circuit block diagram illustrating a circuit for generating two of the clock pulse signal lines shown in FIG. 1.
Figure 2B:
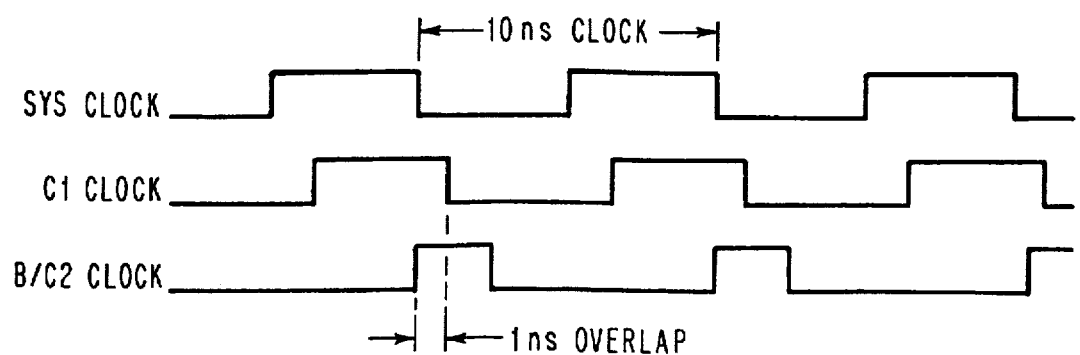
FIG. 2B is a timing diagram illustrating input and output signal timing for the circuit shown in FIG. 2A.

It is noted in FIG. 1 that there are also present other clock and signal lines. In particular, the System Data signal line (labeled D in FIG. 1) provides logical signal information from earlier stages in the overall logic flow path. It is this system data which ultimately drives the logic circuit block (reference numeral 50 in FIGS. 3A and 4A) under normal operating conditions. In addition, in order to rapidly transfer information through the overall system in normal operation, it is desirable to be able to move information into latch L1 and out of latch L1 into latch L2 as quickly as possible. For this purpose, system clocks C1 and C2 are provided. The relative timing of these clock pulses is illustrated in FIG. 2B discussed more particularly below. For high performance in double latch designs, these two system clocks, C1 and C2, are closely synchronized, occur in rapid succession, and may indeed have some overlap, as shown in FIG. 2B. In one exemplar clock design, a single master system clock (or oscillator) is used with the clock pulse being chopped and stretched on each chip so as to provide the needed functional C1 and C2 clocks. Such a clock chopper is shown in FIG. 2A. In general, the master system clock or oscillator ("SYS CLK" in FIG. 2A) is free-running during system operation.

Figure 5A:
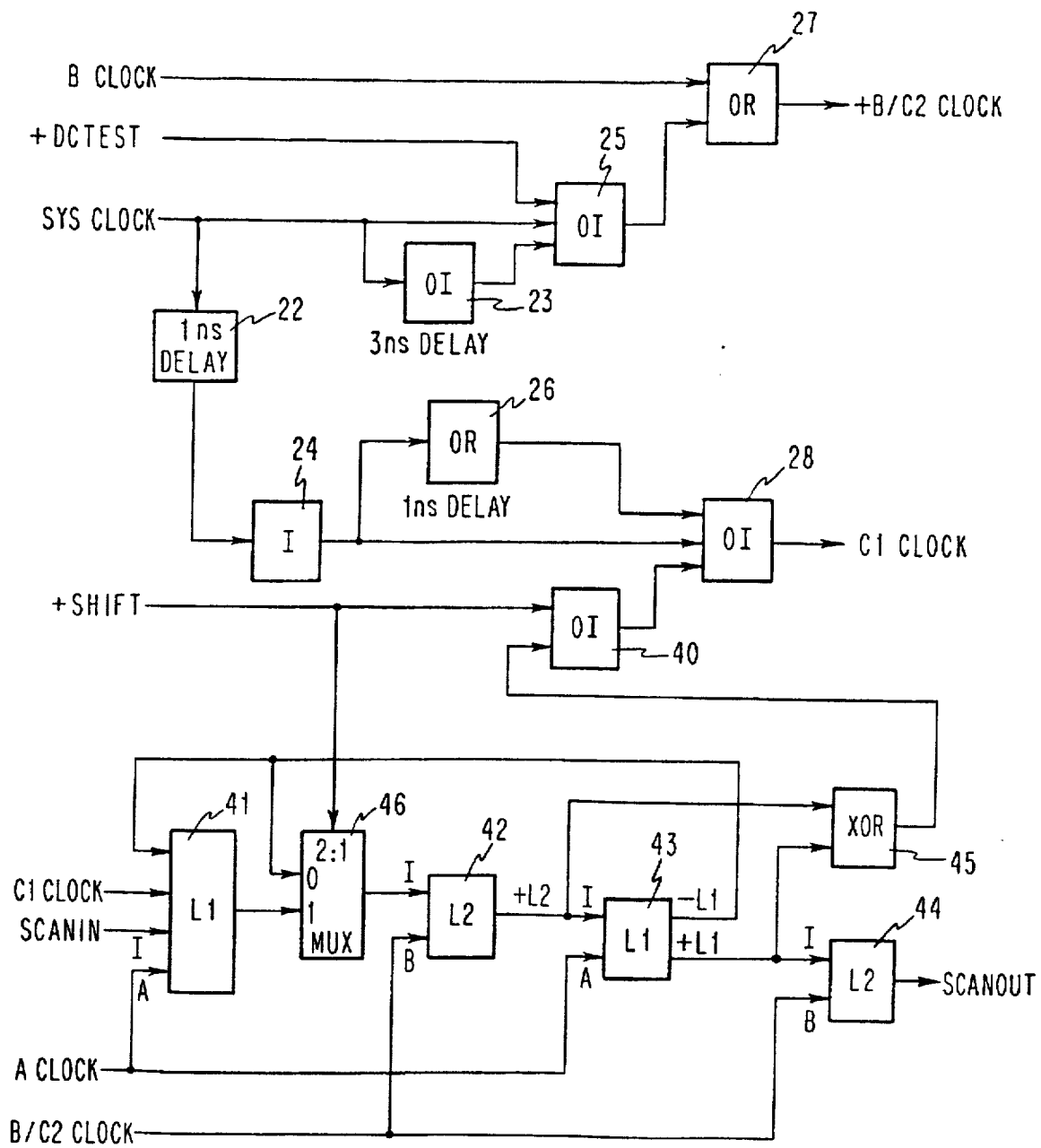
FIG. 5A is a block diagram of a preferred circuit in accordance with the present invention for suppressing a first one of a pair of master-slave clocking pulses.

The clock chopper circuit of FIG. 2A will be modified, in accordance with the present invention, to the improved circuit shown in FIG. 5A. However, it is nonetheless important to understand the function of the input signals and the generation of the output signals from the circuit of FIG. 2A.

For purposes of illustration herein, certain exemplary delay values expressed in nanoseconds are employed to help provide an understanding of the circuitry of FIG. 2A. Two of the three inputs to the circuit of FIG. 2A are: B Clock which when asserted is the LSSD Shift B clock and +DCTest which when asserted prevents the master system clock from generating a C2 clock. In normal system operation, both B Clock and +DCTest are held to a logical 0.

The third input to the circuitry of FIG. 2A, the master system clock (SYS CLK), generates the functional C1 and C2 clocks. The master system clock line is supplied to the inputs of OR-Inverter 23 and OR-Inverter 25. The output of OR-Inverter 23, which merely provides an inversion with a signal delay of 3 nanoseconds, is supplied to an input of OR-Inverter 25. The interaction of the signals on the output of gate 23 and on the SYS CLK line as they appear at gate 25 control the pulse width and timing of the functional C2 clock (the output signal of OR gate 27).

At the same time, the master system clock line (SYS CLK) is supplied to delay circuit 22 which here provides a signal delay of one nanosecond. The signal from delay circuit 22 is supplied to Inverter 24 whose output is supplied directly to OR-Inverter 28. Additionally, the output signal from Inverter 24 is supplied to OR gate 26 which provides a signal delay of one nanosecond, and whose output is also supplied to OR-Inverter 28. It is the output of OR-Inverter 28 which produces the C1 Clock.

For the SYS CLK signal shown in FIG. 2B, which exhibits a 10 nanosecond clock period, the C1 Clock and B/C2 Clock signal outputs are shown. In particular, it is noted that the one nanosecond delay produced in circuit block 22 in FIG. 2A does in fact result in a one nanosecond overlap between the C1 and B/C2 clock signals as shown in FIG. 2B.

Because of the overlap of the C1 and B/C2 clocks shown in FIG. 2B, there is a race condition during system operation. If a fast path (that is, a short path or sneak path) exists between the output of an L2 latch and a system data input to an L1 latch, it is possible for the C2-clock-induced changing output of the L2 latch to propagate to the L1 latch while the C1 clock is still active. This can result in an erroneous value being latched into the L1 and hence into its corresponding L2 slave latch. This is one of the conditions that should be tested during manufacturing test. Likewise, it is also desirable to be able to test for delay or long-path faults as well as for stuck-at faults.

Figure 3B:
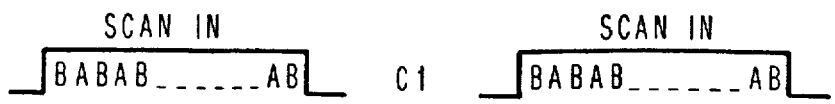
FIG. 3B is a timing diagram illustrating scanning in and capturing operations.

As indicated above, latches L1 and L2 are usually configured in a latch pair which is arranged in a scan string. Such a scan string is shown providing test signals to logic block 50 in FIG. 3A. In the test mode of operation, the A and B clocks are active as shown in FIG. 3B in a BABAB . . . AB sequence so as to effect the input of data from the "Scan Data In" line shown. This information propagates along the string of latch pair SRLs. The important point to note in FIG. 3A is that the scan-in sequence ends with a B clock pulse in a normal test mode of operation. This mode insures that at the end of the B clock pulse, the data in latches L1 and L2 are the same. When the desired test bits are present in latches L2, which supply signals to logic block 50, system clock C1 is employed to capture the output signals from logic block 50. Subsequent scan-in clock sequences also originating and terminating with a B clock signal cause a different set of data to be presented to the logic and make possible the transfer of new capturable information to the latches shown connected to the output signal lines of block 50. It is noted that these latter latches, as shown in FIG. 3A, are also preferably arranged also in the form of a shift register latch scan string, although for the sake of illustrating the generality of applicants' invention this configuration is not specifically shown in FIG. 3A. It is therefore seen that operation illustrated in FIG. 3A as produced by the clock pulse signals in FIG. 3B produce the desired scan-in data capture and new data excitation operations that are desired for stuck-fault test purposes.

In accordance with the present invention a different scan-in modality is employed. In particular, the sequence of scan-in clock pulses ends with the presentation of an A clock pulse. This is referred to as a skewed load. After a skewed load, the values in the L1 and the L2 latches of a master-slave latch pair are not necessarily the same. In particular, when the scan-in data is randomly generated, there is a 0.5 probability that the pair of latches contain different values after a skewed load.

Figure 5B:
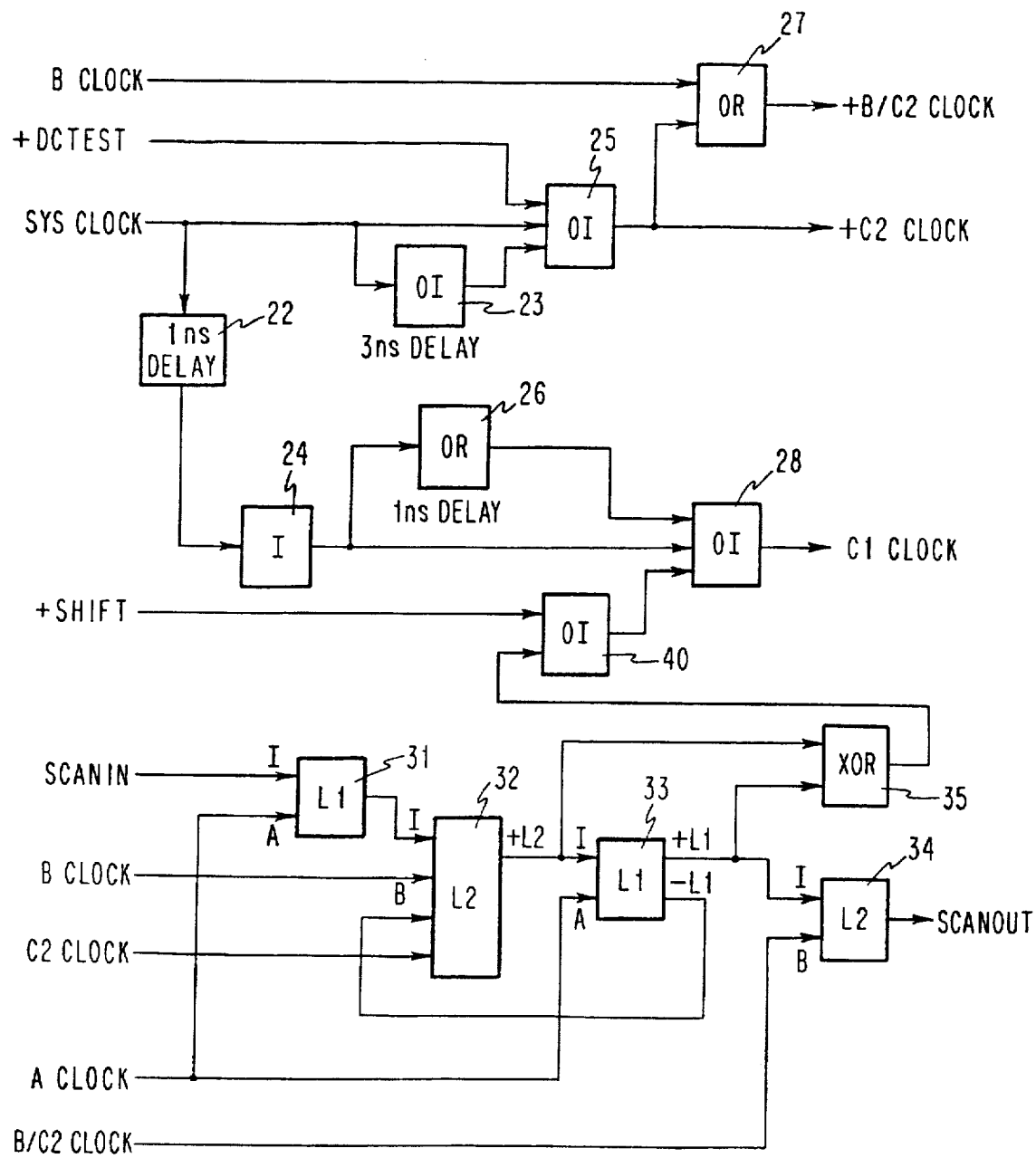
FIG. 5B is a block diagram of an alternative circuit in accordance with the present invention for suppressing a first one of a pair of master-slave clocking pulse.
Figure 5C:
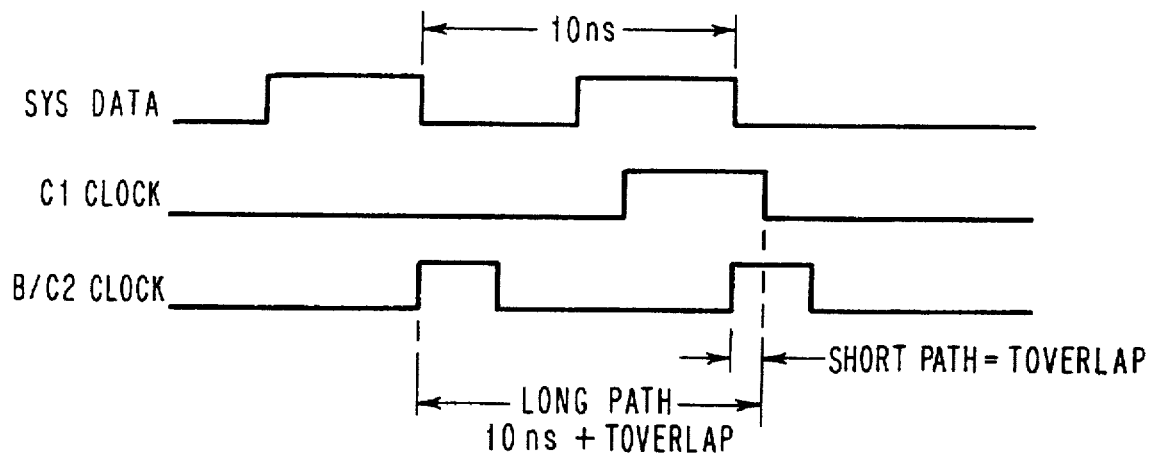
FIG. 5C is a timing diagram illustrating the input and relevant output signals that are generated from the circuits of FIG. 5A and FIG. 5B during short path, long path, and stuck-at fault testing.

Now, under test conditions, the "B CLOCK" and the "+DCTEST" lines of FIG. 2A are held at logical 0 and the "SYS CLK" line is pulsed twice as shown in FIG. 5C. However, the clocking network is modified in accordance with the invention herein to cancel the first C1 clock pulse but to let the second one through as shown in FIG. 5C. However, both B/C2 clock pulses are generated. The first B/C2 clock pulse loads the L2 latch of each shift register latch with the value in its L1 latch. In those cases where the skewed load left different values in L1 and L2, this clock pulse launches a 0 to 1 or 1 to 0 transition into the logic. Then, one cycle later, the second SYS CLK pulse creates a C1/C2 clock pulse pair with the normal overlap. This overlap is illustrated in FIG. 5C. The C1 clock captures, in the L1 latches, the systems logic responses to test stimuli and the C2 clock moves these responses into the L2 latches in readiness for a scan-out operation (here it is particularly assumed that the data capture latches for logic block 50 are in fact arranged in a shift register latch scan string).

Figure 4A:
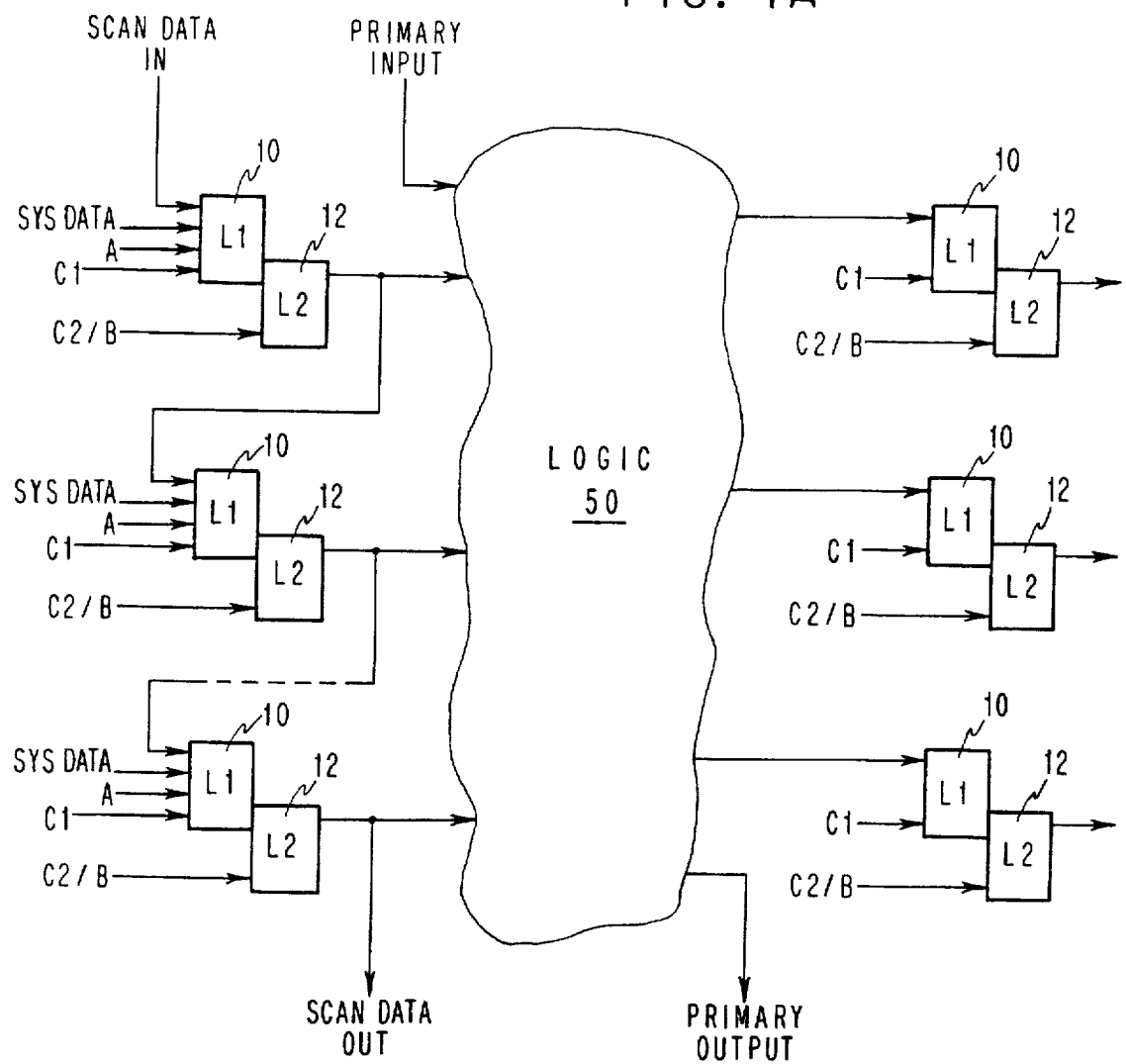
FIG. 4 is a block diagram similar to FIG. 3A but more particularly illustrating clock signals supplied in accordance with the present invention.
FIG. 4B is a timing diagram illustrating the clocking of the present invention when employed for delay, short path, and stuck-at fault testing.
Figure 4B:
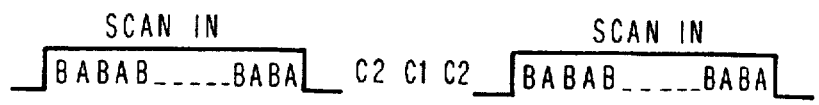

For delay and short path testing, the desired pulse timing sequence for the circuit of FIG. 4A is that shown in FIG. 4B which illustrates a scan-in operation ending in a skewed load, followed by a launch data and a capture data operation. Note however, that this is achieved by suppressing the first C1 clock pulse.

The test timing of FIG. 5C is producible by the circuit of FIG. 5A and possesses several advantages. First, delay testing occurs in those cases where the skewed load leaves different values in corresponding L1 and L2 master-slave latches in the scan string. As noted above, the first B/C2 clock then causes a transition to be propagated into the logic. If there is a path along which the transition propagates to an L1 input, then a test fail indication is provided if the path delay is longer than one clock cycle plus the overlap. Hence, a test at system speed occurs. Secondly, since the last SYS CLK pulse creates a normally overlapped C1/C2 pulse pair, a test also occurs for short paths since the value captured in the receiving shift register latch of the short path is incorrect in this circumstance. Additionally, coverage also occurs for stuck-at faults since such faults can be considered as extreme cases of a delay fault condition.

A circuit which is preferable for achieving the desired timing objectives of the present invention is shown in FIG. 5A. The clock chopper portion of this circuit has been discussed above with respect to consideration of the circuit shown in FIG. 2A. However, it is noted that in the circuit of FIG. 5A a third input signal line is applied to OR-Inverter gate 28. This signal line is provided from the output of OR-Inverter 40 which receives a control signal referred to in FIG. 5A as "+SHIFT." This signal, when at a logical 1, disables the C1 clock swallower portion of the circuitry (thus allowing the master system clock SYS CLK to control the C1 clock in normal operation).

Two shift register latches (each comprising an L1/L2 latch pair) are added to the clock network of FIG. 2A to achieve the timing objectives of the present invention. The two contiguous SRLs as shown in FIG. 5A, the first formed by L1 latch 41 and L2 latch 42 and the second by L1 latch 43 and L2 latch 44, are included in one of the scan strings. Note the 2:1 multiplexer 46 between latches 41 and 42, and note that signal line +SHIFT when at a logical 1 establishes a normal scan path through latch pair 41 and 42. Note also that the SRL formed by latches 43 and 44 is a scan-only SRL (in that it has no system data port).

During normal system operation of FIG. 5A, the input marked +SHIFT is held to logical 1, input +DCTEST is held to a logical 0, and the A CLOCK and B CLOCK lines are held off. Now toggling the master system clock SYS CLK will cause the C1 CLOCK and the B/C2 CLOCK to operate normally.

To scan through the SRLs of the clocking network of FIG. 5A, input +SHIFT is held to logical 1 and master system clock SYS CLK and +DCTEST are both held to logical 0. Scanning is then done using the A CLOCK and the B CLOCK inputs (the B CLOCK generating a B/C2 CLOCK).

To begin test timing with FIG. 5A, hold input +SHIFT to 1, and hold both master system clock SYS CLK and +DCTEST to 0. Load the SRLs now with test data using the A and B Clocks, ending the shift operation with the last A Clock (this is a skewed load). Both A and B Clocks are now held off until the next shifting operation. The skewed load of the test data leaves the same values in L2 latch 42 and L1 latch 43 of FIG. 5A. Now Exclusive-OR gate 45 has the same value on both of its inputs, and its output is 0. This 0 value is applied to the other input of OR-Inverter gate 40.

Next set +SHIFT to 0 and keep +DCTEST at 0. Now pulse the master system clock SYS CLK twice. The C1 CLOCK pulse that would normally occur from the first system clock pulse is held off because the two inputs to OR-Inverter 40 are 0, and its output 1 signal holds the output of OR-Inverter gate 28 to 0. However, the first B/C2 clock pulse does occur.

Now since +SHIFT is 0, the output of multiplexer 46 is set to the −L1 output of latch 43 and this first B/C2 clock pulse loads the inverse of the value of latch 43 back into latch 42. Since the values in latches 42 and 43 are now different, the output of Exclusive-OR 45 goes to 1 and the output of OR-Inverter gate 40 goes to a logical 0. This allows the second system clock pulse (as shown in FIG. 5C) to create a normal functional clock pair (C1 followed by B/C2).

Normally there is an overlap between C1 CLOCK and B/C2 CLOCK. If the delay on the path from latch 42 through Exclusive-OR gate 45 and OR-Inverter gate 40 were short enough, the changing value in latch 42 caused by the first B/C2 clock pulse might ripple through to the output of OR-Inverter 40 and allow a portion of the first C1 Clock to occur. This would invalidate the long path or delay test. To prevent this, the delay on this path must be greater than the overlap (padding must be added if necessary).

An alternative circuit for achieving the timing objectives of the present invention is shown in FIG. 5B. Again, the clock chopper portion of this circuit has been discussed with respect to the circuit of FIG. 2A. And, in the circuit of FIG. 5B, a third input signal line is applied to OR-Inverter gate 28. And again this signal line is provided from the output of OR-Invert gate 40 which receives a control signal referred to in FIG. 5B as "+SHIFT." When this signal is at a logical 1 the C1 clock swallower portion circuitry of 5B is disabled, thus allowing the master system clock SYS CLK to control the C1 clock during normal operation.

Two added shift register latches shown in FIG. 5B are L1 latch 31 combined with L2 latch 32, and L1 latch 33 combined with L2 latch 34. Notice particularly that L2 latch 32 (conveniently called an L2* latch) has two independent data ports. The first port is fed by the associated L1 latch 31 and clocked by B CLOCK. This allows the L2* latch to perform as the slave latch in the shift register path. The second data port is an independent port clocked by C2 CLOCK to permit loading into the L2* latch the inverse of the value contained in L1 latch 33. Also note that the L2* latch is clocked either by the B CLOCK (shown as an input at the top of FIG. 5B) or the C2 CLOCK signal shown generated by OR-Inverter block 25 of FIG. 5B, and is specifically not clocked by the B/C2 CLOCK line generated by OR gate 27.

The second SRL in FIG. 5B, formed from latches 33 and 34, is a scan-only SRL and as such does not have a port for accepting system data. The two SRLs are connected in a conventional scan path as shown in FIG. 5B. Of particular note is the feedback path from the logical inverse of latch 33 back to the second data input of latch 32.

During normal system operation, the signal line SHIFT is set to a logical 1 to disable the C1 clock swallower circuit and to allow the master system clock SYS CLK to control the C1 clock, and the signal line +DCTEST is set to a logical 0 to allow the master system clock to control the B/C2 CLOCK. In addition, the A Clock and B Clock shifting lines are held to a logical 0 to prevent shifting.

To start testing operations with the circuit of FIG. 5B, the +DCTEST line is set to logical 1, and both the SYS CLK and the +SHIFT signal lines are set to logical 0. Now the shift register latch scan strings are loaded with test data using the Shift A and Shift B clocks, and in particular ending the shifting operation with an A clock pulse (a skewed load). Now both the Shift A and the Shift B clocks are held off until the next shifting operation. The skewed load of the test stimuli leaves the same values in latches 32 and 33 of FIG. 5B. Accordingly, Exclusive-OR gate 35 "sees" the same values on both of its input signal lines and its output signal line therefore becomes a logical 0. This logical 0 signal value is applied to OR-Inverter gate 40.

Next the +DCTEST signal line is set to a logical 0 while the +SHIFT signal line is kept at logical 0. The SYS CLK line is pulsed twice (see FIG. 5C). The C1 CLOCK pulse that would normally occur from the first SYS CLK pulse is held off by the logical 1 on the output of OR-Invert gate 40. However, the first B/C2 CLOCK occurs as shown in FIG. 5C. Notice that there will also be a pulse on the C2 CLOCK line output of block 25. This pulse will load the inverse of the value in latch 33 back into latch 32. Now Exclusive-OR gate 35 has different values on its inputs and, accordingly, its output goes to a logical 1. Because of the connection between the output of Exclusive-OR gate 35 and the input to OR-Invert gate 40, the C1 clock swallower is inhibited. This allows the second SYS CLK pulse to create a normal C1/C2 clock pair.

Again in FIG. 5B delay padding may be needed in the path from latch 32 through Exclusive-OR gate 35 and OR-Invert gate 40 to prevent the value change in latch 32 caused by the C2 clock from affecting the output of OR-Invert gate 40 and thereby allowing a portion of the first C1 clock to occur.

Figure 6:
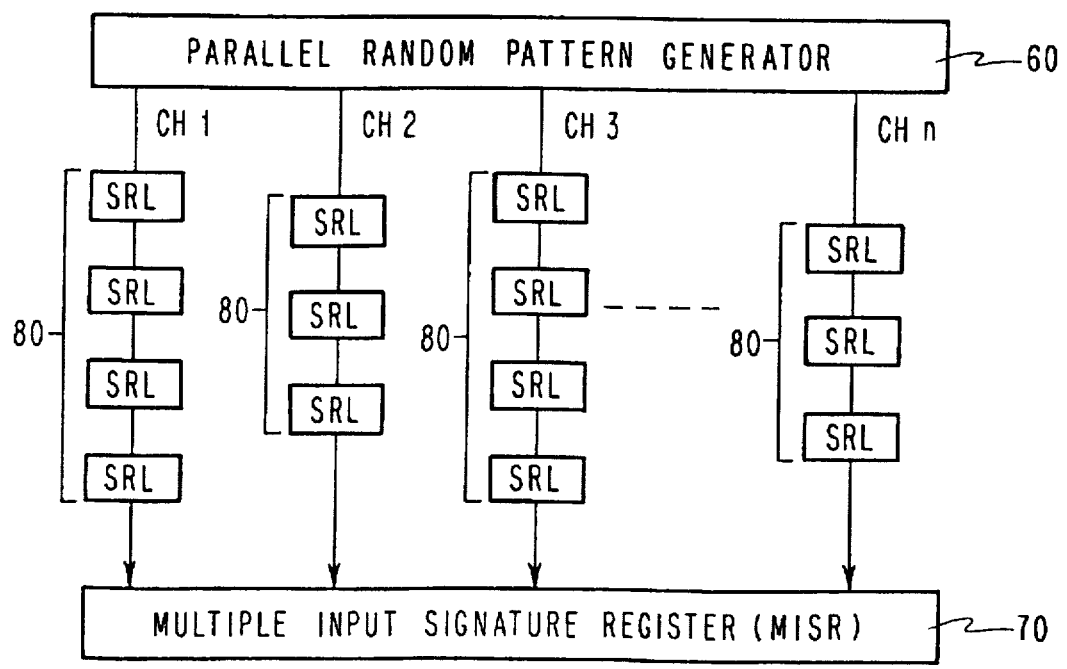
FIG. 6 is an overall block diagram illustrating the context in which the present invention may be combined with shift register scan strings and LSSD methodology to provide a built-in test for short path, long path, and stuck-at faults.

Another environment in which the present invention can be used is in built-in test or self-test. A methodology for self-testing in an LSSD environment is described in U.S. Pat. No. 4,503,537 issued to William McAnney, a co-inventor herein, on Mar. 5, 1985, and assigned to the same assignee as the present invention. In this method, illustrated in FIG. 6 herein, the scan inputs of the shift register strings are fed by a so-called parallel pseudo-random pattern generator 60, and the scan outputs of the shift register strings are fed into a so-called multiple input signature register or MISR 70. During test, pseudo-random values are scanned into the SRLs 80 to be used as test stimuli. After cycling the system clocks the signals captured into the SRLs are scanned out and "compressed" within the MISR to form a resultant or signature at the end of the test that can be compared with the expected or good signature for a pass/fail decision.

From the above, it should be appreciated that by means of simple enhancement to clocking circuitry, it is possible to conduct delay and short path tests which were not hereto possible, as well as stuck-at fault tests, on logic circuit functional blocks. In particular, it should be appreciated that the circuit of the present invention provides a mechanism for the suppression of a first one of a pair of signal capture clocking signals so that instead of capturing previously generated data it becomes possible to capture transition signals through the logic block being monitored. The generation of these transition signals is accomplished by a means of a skewed load which occurs during the scanning of test data into the scan string. It should also be appreciated that all of this functionality is provided without negatively impacting in any way the prior functioning of stuck-fault testing. It should be appreciated that this enhanced testing capability is an important aspect of the ability to drive logic circuits at higher rates of speed while still maintaining design and testing integrity for both the traditional stuck-at faults and for delay and short path faults.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

The invention claimed is:

1. A digital logic circuit for testing a logic circuit block which has a set of input signal lines and a set of output signal lines, said circuit for testing comprising:

a first shift register latch scan string having a plurality of latch pairs with each one of said pairs including a master latch and a slave latch and with output signal lines of said slave latches being connected to the input signal lines of said logic circuit block and also with output signal lines of said slave latches being connected to a single subsequent master latch in these scan strings so as to form a shift register;

a second set of latch pairs with each one of said second set including a master latch and a slave latch with said output signals of said logic circuit block being connected to input signal lines of said master latches in said second set of latch pairs;

first clock means for shifting signal values along said scan string one latch at a time;

second clock means for controlling the loading of output signal values from said logic circuit block into said master latches in said second set of latch pairs;

third clock means transferring signal values from said master latches to the respective slave latches in said shift register latch scan string without transferring signal values between said latch pairs therein;

finite state machine means for suppressing a single pulse from said second clock means, said means for suppressing being driven by said first clock means and also by said third clock means, whereby it is assured that a pulse from said third clock means occurs earlier than a pulse from said second clock means.

2. The digital logic circuit of claim 1 in which said second set of latch pairs is also configured as a shift register latch scan string.

* * * * *

UNITED STATES PATENT AND TRADEMARK OFFICE
CERTIFICATE OF CORRECTION

PATENT NO. : 5,617,426
DATED : April 1, 1997
INVENTOR(S) : Koenemann et al.

It is certified that error appears in the above-indentified patent and that said Letters Patent is hereby corrected as shown below:

Column 4, line 15    "FIG. 4" should be --FIG. 4A--

Signed and Sealed this

Twenty-ninth Day of July, 1997

Attest:

BRUCE LEHMAN

Attesting Officer    Commissioner of Patents and Trademarks